(12) United States Patent  
Bornstein

(10) Patent No.: US 8,390,100 B2
(45) Date of Patent: Mar. 5, 2013

(54) CONDUCTIVE OXIDE ELECTRODES

(75) Inventor: Jonathan Bornstein, Cupertino, CA (US)

(73) Assignee: Unity Semiconductor Corporation, Sunnyvale, CA (US)

(*) Notice: Subject to any disclaimer, the term of this patent is extended or adjusted under 35 U.S.C. 154(b) by 454 days.

(21) Appl. No.: 12/653,854

(22) Filed: Dec. 18, 2009

(65) Prior Publication Data

US 2010/0155953 A1 Jun. 24, 2010

Related U.S. Application Data

(60) Provisional application No. 61/203,153, filed on Dec. 19, 2008, provisional application No. 61/203,192, filed on Dec. 19, 2008, provisional application No. 61/203,163, filed on Dec. 19, 2008, provisional application No. 61/203,187, filed on Dec. 19, 2008.

(51) Int. Cl.
H01L 21/44 (2006.01)

(52) U.S. Cl. .......... 257/656; 257/E29.336; 257/E29.331

(58) Field of Classification Search .................. 257/656
See application file for complete search history.

(56) References Cited

U.S. PATENT DOCUMENTS

| | | |
|---|---|---|
| 6,204,139 B1 | 3/2001 | Liu et al. |
| 6,473,332 B1 | 10/2002 | Ignatiev et al. |
| 6,753,561 B1 | 6/2004 | Rinerson et al. |
| 6,965,137 B2 | 11/2005 | Kinney et al. |
| 7,009,235 B2 | 3/2006 | Rinerson et al. |
| 7,038,935 B2 | 5/2006 | Rinerson et al. |
| 7,095,643 B2 | 8/2006 | Rinerson et al. |
| 7,186,569 B2 | 3/2007 | Rinerson et al. |
| 7,326,979 B2 | 2/2008 | Rinerson et al. |
| 7,417,271 B2 | 8/2008 | Genrikh et al. |
| 7,608,467 B2 | 10/2009 | Wu et al. |
| 7,742,323 B2 | 6/2010 | Rinerson et al. |
| 7,764,160 B2 | 7/2010 | Kawano et al. |
| 7,796,416 B2 | 9/2010 | Ishihara et al. |
| 7,884,349 B2 | 2/2011 | Rinerson et al. |
| 7,985,963 B2 | 7/2011 | Rinerson et al. |
| 7,990,754 B2 | 8/2011 | Azuma et al. |
| 7,995,371 B2 | 8/2011 | Rinerson et al. |
| 7,999,307 B2 | 8/2011 | Kim et al. |
| 8,031,509 B2 | 10/2011 | Schloss et al. |
| 8,031,510 B2 | 10/2011 | Schloss et al. |
| 8,045,364 B2 | 10/2011 | Schloss et al. |
| 2003/0003675 A1 | 1/2003 | Hsu |
| 2005/0174835 A1 | 8/2005 | Rinerson et al. |
| 2006/0171200 A1* | 8/2006 | Rinerson et al. ........... 365/185.1 |
| 2007/0105390 A1* | 5/2007 | Oh ................................ 438/710 |
| 2009/0045390 A1 | 2/2009 | Rinerson et al. |

(Continued)

OTHER PUBLICATIONS

I.G. Baek et al., "Realization of Vertical Resistive Memory (VRRAM) Using Cost Effective 3D Processes", Samsung Electronics Co., Ltd., IEDM 2011, 31.8.1, pp. 737-740.

Primary Examiner — Steven Loke
Assistant Examiner — Kimberly M Thomas
(74) Attorney, Agent, or Firm — Stolowitz Ford Cowger LLP

(57) ABSTRACT

Conductive oxide electrodes are described, including a bi-layer barrier structure electrically coupled with an adhesion layer, and an electrode layer, wherein the bi-layer barrier structure includes a first barrier layer electrically coupled with the adhesion layer, and a second barrier layer electrically coupled with the first barrier layer and to the electrode layer. The conductive oxide electrodes and their associated layers can be fabricated BEOL above a substrate that includes active circuitry fabricated FEOL and electrically coupled with the conductive oxide electrodes through an interconnect structure that can also be fabricated FEOL. The conductive oxide electrodes can be used to electrically couple a plurality of non-volatile re-writeable memory cells with conductive array lines in a two-terminal cross-point memory array fabricated BEOL over the substrate and its active circuitry, the active circuitry configured to perform data operations on the memory array.

30 Claims, 11 Drawing Sheets

U.S. PATENT DOCUMENTS

| | | |
|---|---|---|
| 2010/0155722 A1 | 6/2010 | Meyer |
| 2010/0155953 A1 | 6/2010 | Bornstein |
| 2010/0157657 A1 | 6/2010 | Rinerson et al. |
| 2010/0157710 A1 | 6/2010 | Lambertson et al. |
| 2010/0159641 A1 | 6/2010 | Rinerson et al. |
| 2010/0159688 A1 | 6/2010 | Rinerson et al. |
| 2011/0151617 A1 | 6/2011 | Brewer |
| 2011/0204019 A1 | 8/2011 | Bornstein et al. |
| 2011/0220860 A1 | 9/2011 | Kim et al. |
| 2011/0266538 A1 | 11/2011 | Lee et al. |
| 2011/0278532 A1 | 11/2011 | Rinerson et al. |

* cited by examiner

CONDUCTIVE OXIDE ELECTRODES

CROSS-REFERENCE TO RELATED APPLICATIONS

1. Field of the Invention

The present invention relates generally to semiconductors and memory technology. More specifically, conductive oxide electrodes and corresponding methods are described, including bi-layer electrode structures for non-volatile memory devices.

2. Background

Data storage in high-density memory devices can be accomplished using a variety of techniques. Often, the technique used depends upon whether or not the stored data is volatile or non-volatile. In volatile memory devices, such as SRAM and DRAM, for example, stored data is not retained when power is removed from the memory device. On the other hand, for non-volatile memory devices, such as MRAM and FLASH devices, stored data is retained when power is removed from the memory device.

Certain non-volatile memory devices having a memory element employ conductive metal oxides (CMO) as solid state devices. The CMO may retain a resistive state after being exposed to an electronic pulse. Typically, each conductive memory device includes a conductive top and bottom electrode and the memory element. The memory element may be a multi-resistive state element that is arranged on top of and in contact with the bottom electrode. Additionally, the conductive top electrode may be arranged on top and in contact with the multi-resistive state memory element.

Typically, electrodes are embodied as a thin film layer formed from materials that can include Pt, Au, Ag and Al. Using platinum (Pt) alone as a material to form the electrodes has been problematic. For example, Pt can act as a catalyst for hydrogen during fabrication of the memory device, yielding reactive hydrogen, an undesired result.

Furthermore, memory devices utilizing conventional electrodes also suffer from degradation due to the electric field-assisted migration and inter-diffusion of metal atoms from the electrode layer to the memory material layer. It would be ideal to be able to mitigate the effects of inter-diffusion.

Thus, solutions for preventing hydrogen and other materials from reacting with the electrode material during memory device fabrication and for mitigating inter-diffusion effects without the limitations of the conventional techniques are needed.

BRIEF DESCRIPTION OF THE DRAWINGS

Various examples are disclosed in the following detailed description and the accompanying drawings.

Figure 1:
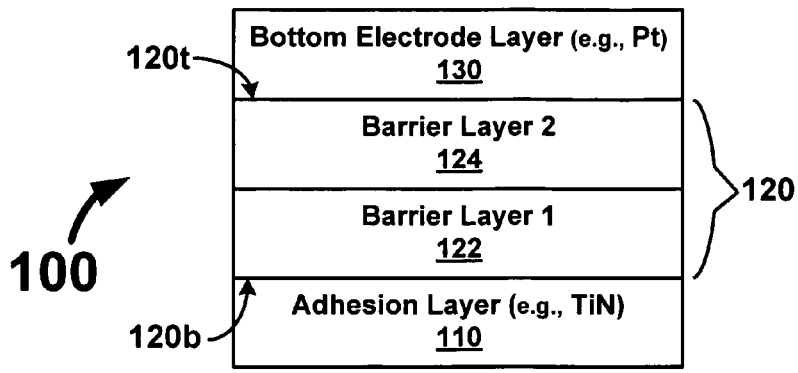
FIG. 1 depicts a cross-sectional view of an exemplary bottom conductive oxide electrode with bi-layer structure.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, techniques such as those described herein enable emulation of multiple memory types for implementation on a single component such as a wafer, substrate, or die. U.S. patent application Ser. No. 11/095,026, filed Mar. 30, 2005, now U.S. Published Application No. 2006/0171200, and entitled "Memory Using Mixed Valence Conductive Oxides," is hereby incorporated by reference in its entirety and for all purposes and describes non-volatile third dimensional memory elements that may be arranged in a two-terminal, cross-point memory array. The memory elements can be a component of a memory cell that includes electrically in series with the memory element, other structures including but not limited to a non-ohmic device (NOD) and electrodes. New memory structures are possible with the capability of this third dimensional memory array. The technology allows for the emulation of other memory technologies by duplicating the interface signals and protocols, while accessing the third dimensional memory array. The third dimensional memory array may emulate other types of memory, providing memory combinations within a single component. In at least some embodiments, a two-terminal memory cell can be configured to change conductivity when exposed to an appropriate voltage drop across the two-terminals. The memory cell can include an electrolytic tunnel barrier and a mixed valence conductive oxide (e.g., a memory element) in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of a mixed valence conductive oxide, according to some embodiments.

In some embodiments, an electrolytic tunnel barrier, one or more mixed valence conductive oxide structures, and electrodes and other thin film layers, do not need to operate in a silicon substrate, and, therefore, can be fabricated back-end-of-the-line (BEOL) above circuitry being used for other purposes fabricated front-end-of-the-line (FEOL). Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½-VW1 to the Y-direction line), the memory cell can switch to a low resistive state. When a second write voltage, VW2, is applied across the memory cell (e.g., by applying ½ VW2 to the X-direction line and ½-VW2 to the Y-direction line), the memory cell can switch to a high resistive state. Memory cells using electrolytic tunnel barriers and mixed valence conductive oxides can have VW1 opposite in polarity from VW2. The conductive oxide electrodes described herein can be used to electrically communicate the above mentioned voltages to memory cells for data operations (e.g., read and write operations, program and erase operations) to the memory cells.

FIG. 1 depicts a cross-sectional view of an exemplary bottom conductive oxide electrode with bi-layer structure. Here, bottom conductive oxide electrode with bi-layer structure 100 (also referred to as "bottom electrode with bi-layer structure 100") may include adhesion layer 110, bi-layer structure 120, and bottom electrode layer 130. In some examples, adhesion layer 110 may promote bonding between layers of materials of bottom electrode with bi-layer structure 100. Exemplary materials for adhesion layer 110 include, but are not limited, to binary nitrides such as, titanium nitride (TiN), titanium aluminum nitride (TiAlN), titanium silica nitride (TiSiN), and tantalum nitride (TaN).

Bottom electrode layer 130 may enable operational voltages (e.g., read, write, program, erase, half-select) to be applied to memory element materials (not shown) that may be in electrically coupled with bottom electrode layer 130. Bottom electrode layer 130 may be formed from an electrically conductive material, including, but not limited to, a noble metal, a noble metal alloy, platinum (Pt), tungsten (W), aluminum (Al), copper that may be encapsulated with a cladding to prevent oxidation, tin oxide, gold, or a conductive oxide material by way of examples.

Bottom electrode with bi-layer structure 100 may include several thin film layers. In addition to adhesion (or glue) layers, and by way of examples, these thin film layers may include, but are not limited to, diffusion barriers, anti-reflection layers, and the like. Bi-layer structure 120 may be examples of diffusion barriers and may include a first barrier layer 122 (also referenced as "barrier layer 1, 122"), and a second barrier layer 124 (also reference as "barrier layer 2, 124"). In some applications, bi-layer structure 120 may prevent inter-diffusion of hydrogen, oxygen, nitrogen or metals that may migrate from the adhesion layer through bottom electrode layer 130 and into a memory material layer (not shown) that may be disposed adjacent to bottom electrode layer 130. As examples, first barrier layer 122 and second barrier layer 124 may be used to buffer migration of TiN from layer 110 through electrode layer 130 and into an adjacent thin-film of memory material (e.g., conductive metal oxide layer, not shown). Bi-layer structure 120 may include a top surface 120t and a bottom surface 120b, both of which may be substantially planar surfaces or share similar undulations. In some examples, surfaces 120t and 120b may be configured for stacked configuration memory array structures.

Bi-layer structure 120 may be configured to enable structure 100 to function as a conductive oxide electrode. First barrier layer 122 may be formed from a material that may not be an oxide initially, but may either achieve oxidization during processing or operation to form second barrier layer 124, or may be coupled to an oxidized layer that forms second barrier layer 124. In some examples, first barrier layer 122 may be formed from iridium (Ir), and second barrier layer 124 may be formed from an iridium oxide (IrO$_x$), such that bi-layer structure 122/124 may be referenced as Ir/IrO$_x$ layers, where x>1. In some examples, iridium oxide may be IrO$_2$. In other examples, first barrier layer 122 may be formed from iridium oxide (IrO$_x$), and second barrier layer 124 may be formed from Ir. There may be several examples of forming bi-layer structure 120 that is, forming first barrier layer 122 and second barrier layer 124 as may be described in FIGS. 2A-E.

Figure 2A:
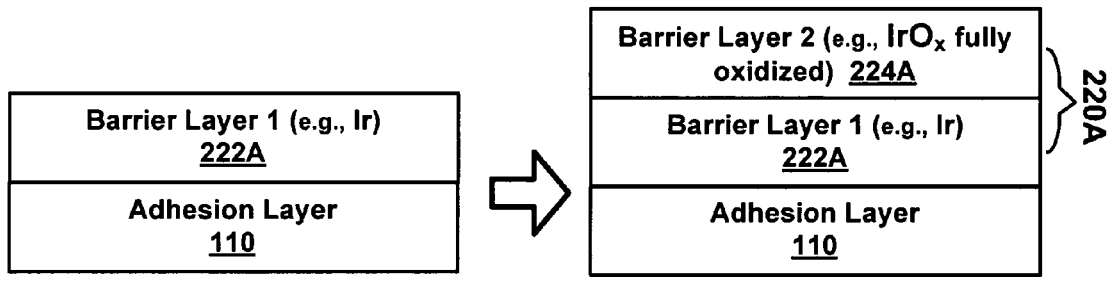
FIGS. 2A-E depict cross-sectional views of partially-formed and exemplary bi-layer structures.

FIG. 2A depicts a cross-sectional view of a partially-formed and exemplary bi-layer structure that may be used with bottom electrode structure 100. Here, bi-layer structure 220A may be electrically coupled with adhesion layer 110, and includes first barrier layer 222A, and second barrier layer 224A. In some examples, adhesion layer 110 may be deposited to promote bonding between layers of materials, followed by a first barrier layer of iridium 222A, which may also be deposited. In some examples, these layers may be deposited by reactive sputtering from an Ir target, in which the addition of ambient oxygen into a sputtering chamber may enable formation of an oxide upon a surface of Ir layer 222A to thereby create second barrier layer 224A, of IrO$_x$. In some examples, the oxidation process may be implemented until second barrier layer 224A forms as a fully oxidized IrO$_x$ layer; this process may involve selecting a specified time for ambient oxygen to fully consume a layer of Ir deposited upon layer 222A.

Figure 2B:
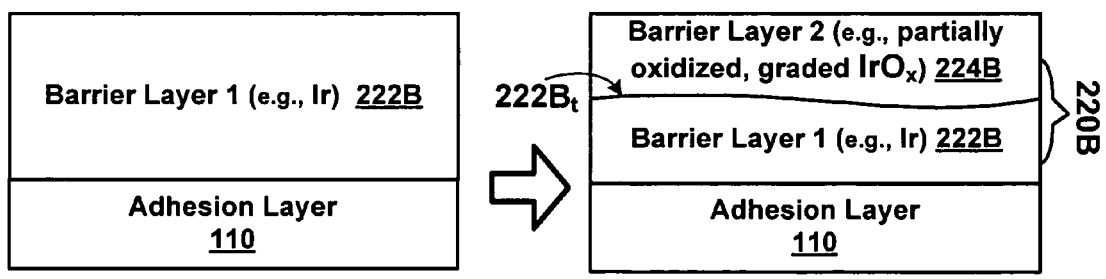

FIG. 2B depicts a cross-sectional view of another partially-formed and exemplary bi-layer structure that may be used with bottom electrode structure 100. Here, bi-layer structure 220B may be electrically coupled with adhesion layer 110, and includes first barrier layer 222B, and second barrier layer 224B. In some examples, adhesion layer 110 may be formed by sputtering, and first barrier layer 222B (e.g., Ir) may be deposited upon adhesion layer 110 by sputtering. Layer 222B may then be partially oxidized, that is, a portion of Ir that remains un-oxidized may form first barrier layer 222B, and a remaining portion of Ir that has been partially oxidized may form layer 224B (as indicated by reference line 222B$_t$). In other examples, a layer of Ir may be deposited upon first barrier layer 222B (e.g., Ir) and may be controllably oxidized with reactive sputtering techniques to form second barrier layer 224B of graded $IrO_x$. A graded layer of $IrO_x$ may be achieved by controlling parameters such as temperature, time, pressure, and oxygen exposure during the reactive sputtering process. It may be appreciated that such parameters may be varied according to design, and are not limited to the examples described. In some applications, exposing a layer of Ir to an oxidizing ambient oxygen may be implemented at 300 degrees Celsius, at a temperature range of approximately 250-450 degrees Fahrenheit, and for certain fractions of specified times used for achieving full oxidization of a layer 222B.

Figure 2C:
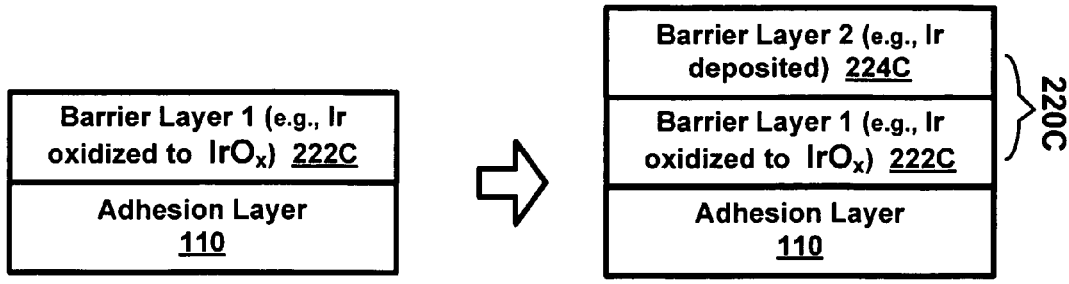

FIG. 2C depicts a cross-sectional view of yet another partially-formed and exemplary bi-layer structure that may be used with bottom electrode structure 100. Here, bi-layer structure 220C may be electrically coupled with adhesion layer 110, and may include first barrier layer 222C, and second barrier layer 224C. Adhesion layer 110 may be formed by sputtering as already described. In some examples, first barrier layer 222C may be formed by depositing a layer of Ir, and oxidizing such Ir layer by reactive sputtering to form first barrier layer 222C, of $IrO_x$. In those examples, a second barrier layer 224C (e.g., Ir) may be deposited upon first barrier layer 222C.

Figure 2D:
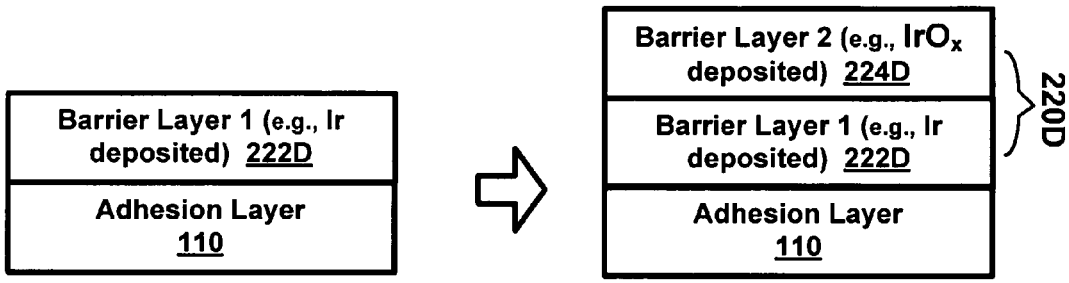

FIG. 2D depicts a cross-sectional view of yet a further partially-formed and exemplary bi-layer structure that may be used with bottom electrode structure 100. Here, bi-layer structure 220D may be electrically coupled with adhesion layer 110, and may include first barrier layer 222D and second barrier layer 224D. Adhesion layer 110 may be deposited as previously described. In some examples, first barrier layer 222D (e.g., Ir) may be deposited to a pre-selected thickness upon adhesion layer 110; and subsequently, second barrier layer 224D (e.g., $IrO_x$) may be deposited to a pre-selected thickness upon layer 222D.

Figure 2E:
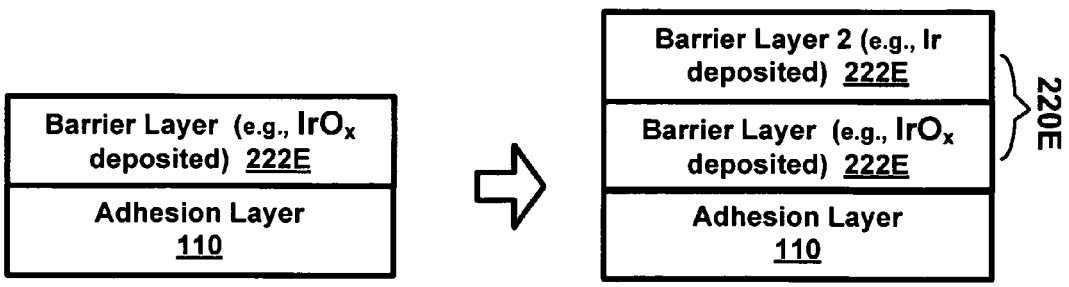

FIG. 2E depicts a cross-sectional view of still a further partially-formed and exemplary bi-layer structure that may be used with bottom electrode structure 100. Here, bi-layer structure 220E may be electrically coupled with adhesion layer 110, and may include first barrier layer 222E, and second barrier layer 224E. Adhesion layer 110 may be deposited as previously described. In some examples, first barrier layer 222E (e.g., $IrO_x$) may be deposited to a pre-selected thickness upon adhesion layer 110; and subsequently, second barrier layer 224E (e.g., Ir) may be deposited to a pre-selected thickness upon layer 222E.

Figure 3:
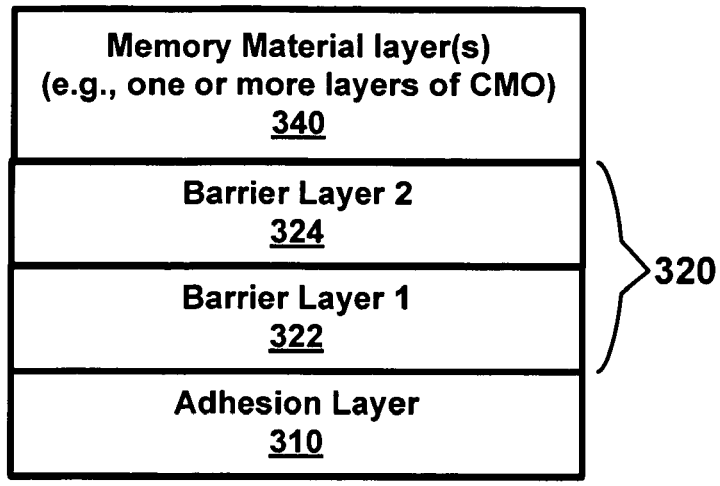
FIG. 3 depicts a cross-sectional view of another exemplary bottom conductive oxide electrode with bi-layer structure.

FIG. 3 depicts a cross-sectional view of another exemplary bottom conductive oxide electrode with bi-layer structure. Here, bottom conductive oxide electrode with bi-layer structure 300 includes: adhesion layer 310; and, bi-layer structure 320. Bi-layer structure 320 may be coupled to one or more layers of memory material, depicted as memory material layer 340. It may be appreciated that the techniques described for adhesion layer 110 may be applicable to forming adhesion layer 310. Bi-layer structure 320 may include first barrier layer 322 and second barrier layer 324, and may be implemented using similar techniques previously described with respect to first barrier layer 122 and second barrier layer 124, respectively, of FIG. 1. In some examples, the techniques describing FIGS. 2A-E may be applicable for forming barrier layers 322 and 324. In other examples, memory material layer 340 may be formed from a conductive metal oxide (CMO) or other perovskite material that typically exhibits memory characteristics. CMOs may be formed from a variety of perovskite materials and may include a mixed valence oxide having substantially mixed crystalline or polycrystalline perovskite structure. Perovskite materials, such as CMO, may include two or more metals being selected from a group of transition metals, alkaline earth metals and rare earth metals. Examples of other perovskite materials may include, but are not limited to, manganites, titanates (e.g., strontium titanate STO, reduced STO), zirconates (SZO:Cr, CNO:Cr, TaO:Cr), LSCO, and high Tc superconductors (e.g., YBCO). Other examples of perovskites include but are not limited to $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), and $LaSrFeO_x$ (LSFeO), where x is nominally 3 for perovskites. The CMO can comprise one or more layers of CMO material such as a bi-layer or tri-layer CMO structure. For example, the structure can include a CMO seed layer with a CMO active layer deposited on the CMO seed layer and a CMO cap layer deposited on the CMO active layer. In some embodiments the cap layer or the seed layer can be eliminated. In other embodiments both the seed layer and the cap layer are eliminate so that there is only one layer of CMO (e.g., the CMO active layer). In yet other embodiments, the CMO can be a conductive binary oxide. The conductive binary oxide can be any metal oxide having the form $A_xO_y$, where A represents a metal and O represents oxygen. The conductive binary oxide may be doped to obtain the desired conductive properties for a conductive metal oxide. For example, depending on the material selected for the conductive binary oxide, elements including but not limited to niobium (Nb), fluorine (F), and nitrogen (N) can be used as dopants to alter the conductivity of the conductive binary oxide. As one example, doping can be accomplished using a co-sputtering process that is well understood in the microelectronics art. Examples of conductive binary oxides that are suitable as a CMO include but are not limited to tin oxide ($SnO_x$), zinc oxide ($ZnO_x$), and a doped titanium oxide ($TiO_x$). The titanium oxide (e.g., $TiO_2$) can be doped with a material including but not limited to niobium (Nb).

Figure 4:
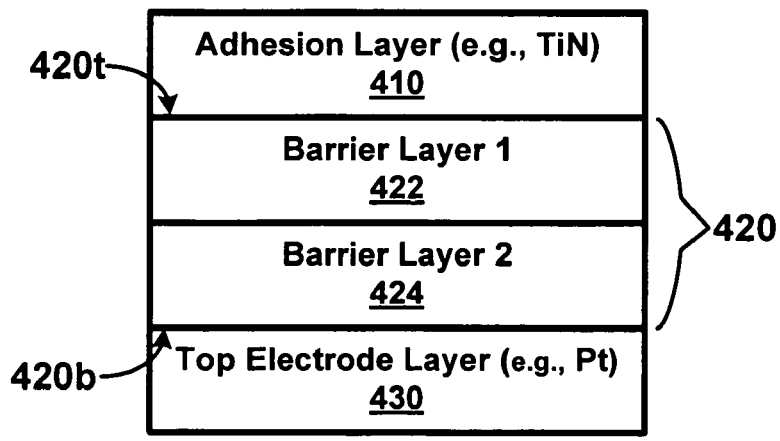
FIG. 4 depicts a cross-sectional view of an exemplary top conductive oxide electrode with bi-layer structure.

FIG. 4 depicts a cross-sectional view of an exemplary top conductive oxide electrode with bi-layer structure. Here, top conductive oxide electrode with bi-layer structure 400 (also referred to as "top electrode with bi-layer structure 400") may include adhesion layer 410, bi-layer structure 420, and top electrode layer 430. Top electrode with bi-layer structure 400 may provide the corresponding electrode structure to bottom electrode with bi-layer structure 100, the pair of which (100, 400) may be used to receive electrical signals for the operation of memory devices. Similar to adhesion layer 110, adhesion layer 410 may promote bonding between layers of materials of top electrode with bi-layer structure 400. Top electrode 430 may enable operational voltages (e.g., read, write, program, erase, half-select) to be applied to memory element materials (not shown) that may be in contact with top electrode layer 430. Top electrode layer 430 may be formed with materials and processes similar to those described for bottom electrode layer 130. Bi-layer structure 420 may include a top surface 420t and a bottom surface 420b, both of which may be substantially planar surfaces or share similar undulations. In some examples, surfaces 420t and 420b may be configured for stacked configuration memory array structures.

Top electrode with bi-layer structure 400 may include several thin film layers. In addition to adhesion (or glue) layers, and by way of examples, these thin film layers may include, but are not limited to, diffusion barriers, anti-reflection layers, and the like. Bi-layer structure 420 may be examples of diffusion barriers and may include first barrier layer 422 (also referenced as "barrier layer 1, 422"), and second barrier layer 424 (also reference as "barrier layer 2, 424"). In some examples, first barrier layer 422 may be formed from Ir, and second barrier layer 424 may be formed from $IrO_x$, such that the bi-layer structure 420 (i.e., 422, 424) may be referenced as $Ir/IrO_x$ layers. In some examples, iridium oxide may be $IrO_2$. In other examples, first barrier layer 422 may be formed from $IrO_x$, and second barrier layer 424 may be formed from Ir. There may be several examples of forming bi-layer structure 420 (i.e., forming first barrier layer 422 and second barrier layer 424 as may be described in FIGS. 5A-E). It may be understood that some of the techniques described in FIGS. 2A-E may be applicable to some examples described in FIGS. 5A-E.

Figure 5A:
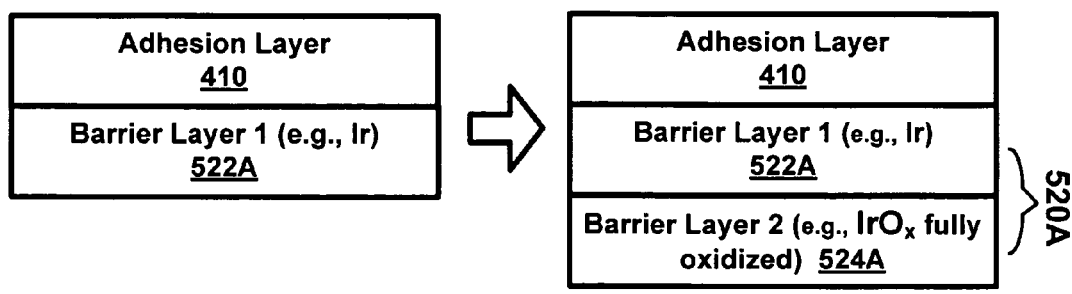
FIGS. 5A-E depict cross-sectional views of other partially-formed and exemplary bi-layer structures.

FIG. 5A depicts a cross-sectional view of a partially-formed and exemplary bi-layer structure that may be used with top electrode structure 400. Here, bi-layer structure 520A may be electrically coupled with adhesion layer 410, and may include first barrier layer 522A, and second barrier layer 524A. In some examples, adhesion layer 410 may be deposited to promote bonding between layers of materials, as previously described with respect to layer 110. First barrier layer 522A (e.g., Ir) may be deposited upon adhesion layer 410, followed by another layer of Ir, which may be deposited by reactive sputtering to create second barrier layer 524A (e.g., $IrO_x$). In some examples, the oxidation process may be implemented until a second barrier layer 524A achieves a fully oxidized $IrO_x$ layer, similar to that described of layer 224A of FIG. 2A.

Figure 5B:
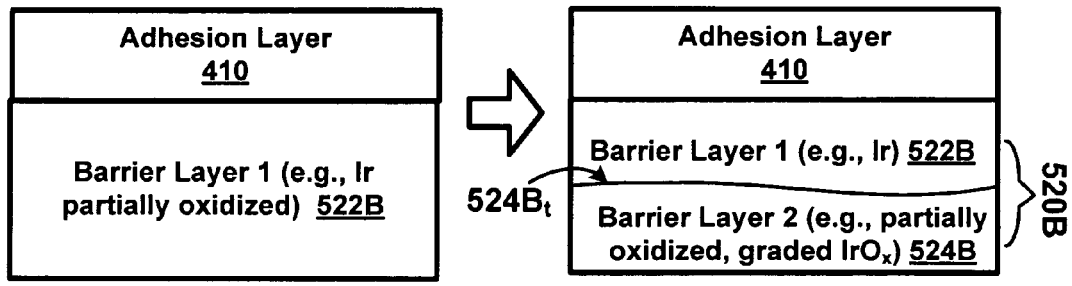

FIG. 5B depicts a cross-sectional view of another partially-formed and exemplary bi-layer structure that may be used with top electrode structure 400. Here, bi-layer structure 520B may be electrically coupled with adhesion layer 410, and may include first barrier layer 522B, and second barrier layer 524B. In some examples, adhesion layer 110 may be formed by sputtering, and first barrier layer 522B (e.g., Ir) may be deposited upon adhesion layer 410 by sputtering. Layer 522B may then be partially oxidized, that is, a portion of Ir that remains un-oxidized may form first barrier layer 522B, and a remaining portion of Ir that has been partially oxidized may form layer 524B (as indicated by reference line 524B$_t$). In other examples, a layer of Ir may be deposited upon first barrier layer 522B and may be controllably oxidized with reactive sputtering techniques to form second barrier layer 524B (e.g., graded $IrO_x$). It may be understood that the techniques described in FIG. 2B may be applicable to FIG. 5B.

Figure 5C:
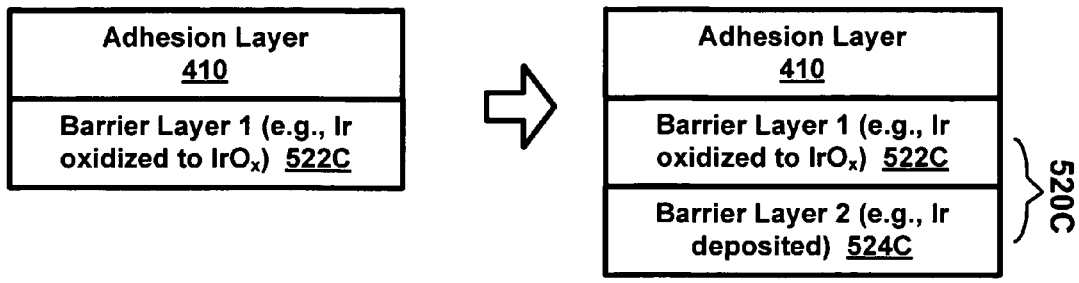

FIG. 5C depicts a cross-sectional view of yet another partially-formed and exemplary bi-layer structure that may be used with top electrode structure 400. Here, bi-layer structure 520C may be electrically coupled with adhesion layer 410, and may include first barrier layer 522C, and second barrier layer 524C. Adhesion layer 410 may be formed by sputtering as already described. In some examples, first barrier layer 522C may be formed by depositing a layer of Ir and oxidizing the Ir layer by reactive sputtering to form first barrier layer 522C (e.g., $IrO_x$). In those examples, second barrier layer 524C (e.g., Ir) may be deposited upon first barrier layer 522C.

Figure 5D:
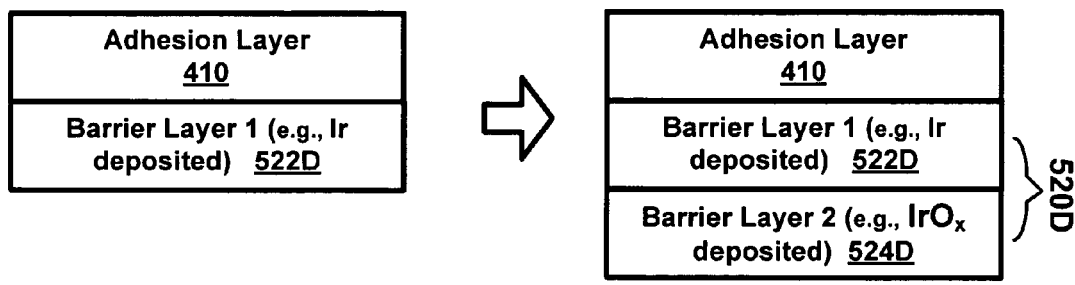

FIG. 5D depicts a cross-sectional view of yet a further partially-formed and exemplary bi-layer structure that may be used with top electrode structure 400. Here, bi-layer structure 520D may be electrically coupled with adhesion layer 410, and may include first barrier layer 522D and second barrier layer 524D. Adhesion layer 410 may be deposited as previously described. In some examples, first barrier layer 522D (e.g., Ir) may be deposited to a pre-selected thickness upon adhesion layer 410; and subsequently, second barrier layer 524D (e.g., $IrO_x$) may be deposited to a pre-selected thickness upon layer 522D. In other examples, second barrier layer 524D in the form of $IrO_x$ may be deposited upon top electrode layer 430 (e.g., Pt), so as to avoid a situation where Ir is initially in contact with Pt because subsequent oxidation of Ir to form $IrO_x$ would not correspond to second barrier layer 524D.

Figure 5E:
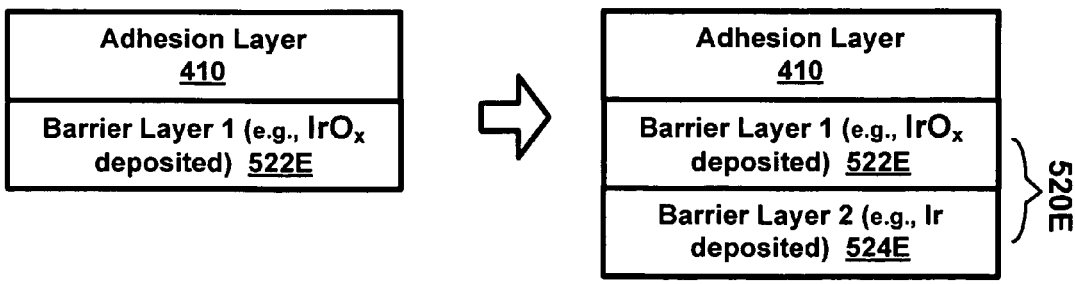

FIG. 5E depicts a cross-sectional view of still a further partially-formed and exemplary bi-layer structure that may be used with top electrode structure 400. Here, bi-layer structure 520E may be electrically coupled with adhesion layer 410, and may include first barrier layer 522E, and second barrier layer 524E. Adhesion layer 410 may be deposited as previously described. In some examples, first barrier layer 522E (e.g., $IrO_x$) may be deposited to a pre-selected thickness upon adhesion layer 410; and subsequently, second barrier layer 524E (e.g., Ir) may be deposited to a pre-selected thickness upon layer 522E.

Figure 6:
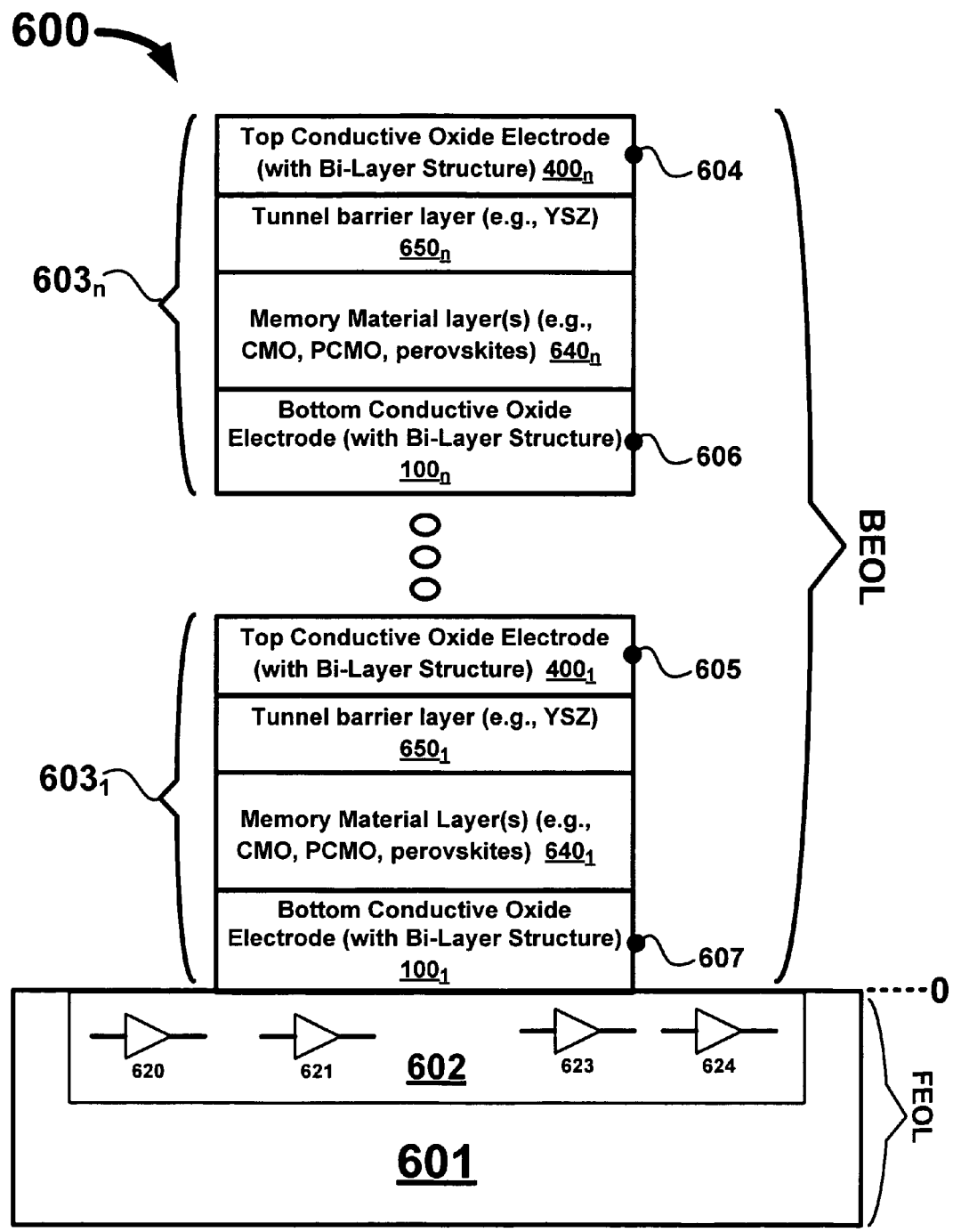
FIG. 6 depicts a cross-sectional view of exemplary non-volatile memory devices that may be used with exemplary top and bottom conductive oxide electrodes with bi-layer structures that can be fabricated BEOL above a substrate and active circuitry fabricated FEOL.

FIG. 6 depicts a cross-sectional view of exemplary non-volatile memory devices that may be used with exemplary top and bottom conductive oxide electrodes with bi-layer structures. Here, stacked memory device 600 includes: substrate 601, active circuitry 602 (e.g., circuitry 620-624), and one or more non-volatile memory devices with top and bottom conductive oxide electrodes with bi-layer structures $603_{1-n}$, where $n \geq 0$. The substrate 601 and active circuitry can be fabricated FEOL as described above; whereas, the stacked memory device 600 can be fabricated BEOL on top of the substrate 601. As one example, the active circuitry can be CMOS circuitry formed using a microelectronics fabrication process. The substrate 601 can include an interconnect structure (now shown) fabricated FEOL that includes plugs, damascene structures, vias, and the like that are configured to electrically communicate signals and voltages from the active circuitry 602 to the stacked memory device 600 (e.g., via conductive array lines fabricated BEOL). For example outputs of active circuits 620 and 621 can be electrically coupled with the electrodes $400_n$ and $100_n$ at nodes 604 and 606, respectively, and outputs of active circuits 623 and 624 can be electrically coupled with the electrodes $400_1$ and $100_1$ at nodes 605 and 607, respectively. The nodes 604, 606, 605, and 607 can represent structural connections (e.g., terminals) between their respective electrodes and conductive array lines of a two-terminal cross-point memory array (not shown). The stacked memory device 600 can be one of a plurality of stacked memory devices 600 positioned in one or more layers of two-terminal cross-point memory array (not shown) fabricated BEOL over the substrate 601. Substrate 601 may be a semiconductor substrate as is known in the art (e.g., a silicon wafer). Active circuitry 602 may include, by way of examples, address, control, data, power, selection, and input/output circuitry that may generate input signals for stacked memory device 600. It may be understood that when n is zero (n=0), stacked memory device 600 may include one non-volatile memory device with top and bottom conductive oxide electrodes with bi-layer structures $603_1$ (also referred to as "top and bottom electrodes with bi-layer structure $603_1$" for brevity). Each device $603_{i,\ i=1\ to\ n}$, includes a bottom conductive oxide electrode with bi-layer structure $100_{i,\ i=1\ to\ n}$, memory material layer $640_{i,\ i=1\ to\ n}$, tunnel barrier layer $650_{i,\ i=1\ to\ n}$, and top conductive oxide electrode with bi-layer structure $400_{i,\ i=1\ to\ n}$. Bottom electrode with bi-layer structures $100_{i,\ i=1\ to\ n}$ correspond to structure 100 already described in FIG. 1. Top electrode with bi-layer structures $400_{i,\ i=1\ to\ n}$ correspond to structure 400 already described in FIG. 4. It may be appreciated that as a point of reference, bottom electrode with bi-layer structures $100_{(1\ to\ n)}$ may refer to electrodes of memory devices $610_{(1\ to\ n)}$ that are formed closer to substrate 601 than a corresponding top electrode with bi-layer structure $400_{(1\ to\ n)}$.

Figure 6A:
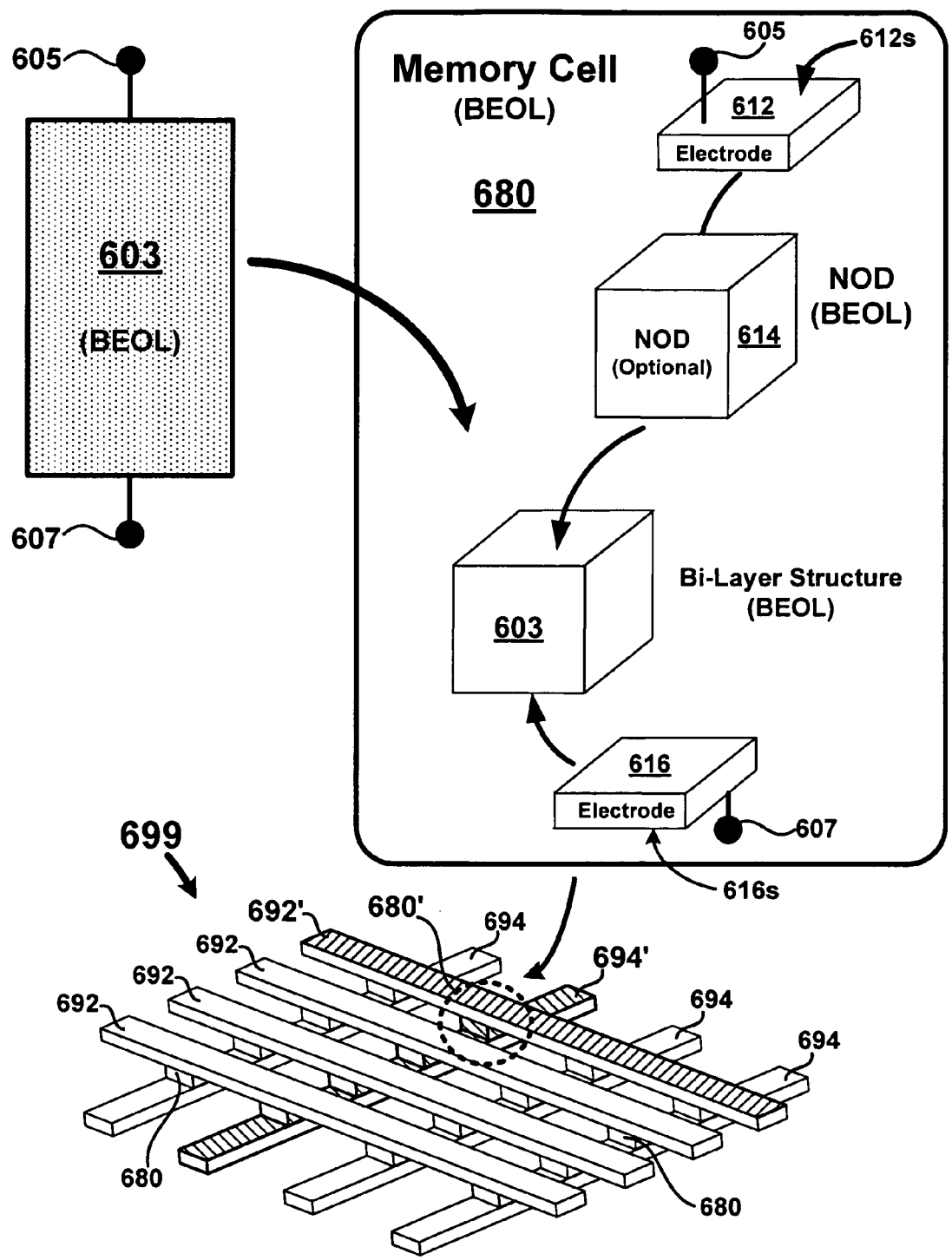
FIG. 6A depicts an example of memory cells positioned in a two-terminal cross-point array.

FIG. 6A depicts an example of arrayed memory cells according to various embodiments of the invention. The aforementioned bi-layer structures described in regards to FIG. 6 are denoted as 603 in FIG. 6A. In this example, a memory cell 680 includes a bi-layer structure 603, which, in turn, includes the layers 400, 650, 640, and 100 as described above. Memory cell 680 further includes the terminals 605 and 607. Terminals 605 and 607 can be electrically coupled with or can be formed as electrodes 612 and 616. The electrodes (612, 616) can be made from an electrically conductive material including but not limited to, platinum (Pt), gold (Au), silver (Ag), iridium (Ir), iridium oxide (IrO$_x$), ruthenium (Ru), palladium (Pd), aluminum (Al), and the like.

In at least some embodiments, memory cell 680 can include a non-ohmic device (NOD) 614, which, in turn, can be formed on the bi-layer structure 603 (e.g., either above or below bi-layer structure 603). NOD 614 can be a "metal-insulator-metal" (MIM) structure that includes one or more layers of electronically insulating material that are in contact with one another and sandwiched between metal layers (e.g., electrodes), or NOD 614 can be a pair of diodes connected in a back-to-back configuration. U.S. patent application Ser. No. 11/881,473, filed Jul. 26, 2007, now U.S. Published Application No. 2009/0027976, and entitled "Threshold Device For A Memory Array" and U.S. patent application Ser. No. 12/283,339, filed Sep. 11, 2008, now U.S. Published Application No. 2009/0016094, and entitled "Selection Device for Re-Writable Memory" are both hereby incorporated by reference in their entirety and for all purposes and describe metal-insulator-metal and diode based non-ohmic devices. NOD 614 can be another type of selection device and the present invention is not limited to the examples disclosed herein. Memory cell 680 can be formed between conductive array lines, such as array lines 692 and 694. Thus, memory cell 680 can be formed in an array of other memory cells. The array can be a cross-point array 699 including a plurality of the conductive array lines 692 and 694, and a plurality of the memory cells 680. For example, array lines 692 can be electrically coupled with the electrodes 612 of the memory cells 680 and/or may be in contact with a surface 612s of the electrodes 612 and array lines 694 can be electrically coupled with the electrodes 616 of the memory cells 680 and/or may be in contact with a surface 616s of the electrodes 616. A memory cell 680' is selected for a data operation (e.g., read or write operation) by applying select voltages (e.g., read voltages, write voltages, program voltages, or erase voltages) to its respective conductive array lines 692' and 694'.

Figure 7:
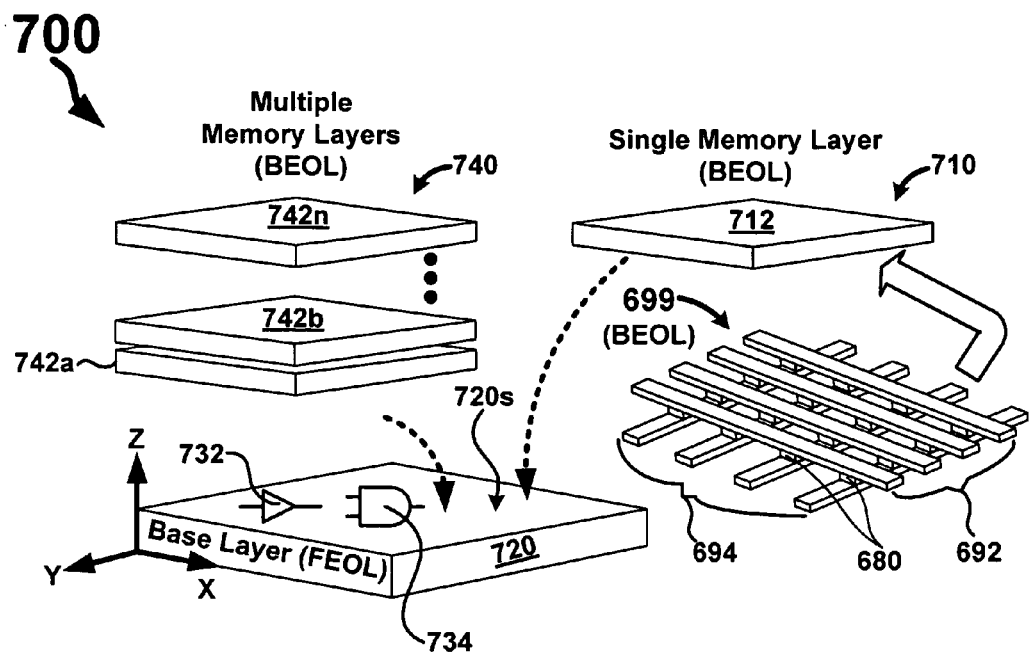
FIG. 7 depicts an integrated circuit including memory cells disposed in a single memory array layer or in multiple memory array layers and fabricated over a substrate that includes active circuitry fabricated in a logic layer.

Turning now to FIG. 7, an integrated circuit 805 can include non-volatile and re-writable memory cells 680 disposed in a single layer 710 or in multiple layers 740 of memory, according to various embodiments of the invention. The single 710 or multiple 740 layers of memory can be fabricated BEOL. In this example, integrated circuit 805 is shown to include either multiple layers 740 of memory (e.g., layers 742a, 742b, . . . 742n) or a single layer 710 of memory 712 formed on (e.g., fabricated above) a base layer 720 (e.g., a silicon wafer). The base layer 720 can be fabricated FEOL with the single or multiple layers of memory 710 and/or 740 fabricate BEOL on top of the base layer 720. In at least some embodiments, each layer of memory (712, or 742a, 742b, . . . 742n) can include the cross point array 699 fabricated (e.g., BEOL) and having conductive array lines (692, 694) arranged in different directions (e.g., substantially orthogonal to one another) to access memory cells 680 (e.g., two-terminal memory cells). For example, conductors 692 can be X-direction array lines (e.g., row conductors) and conductors 694 can be Y-direction array lines (e.g., column conductors). Base layer 720 (e.g., substrate 601 in FIG. 6) can include a bulk semiconductor substrate upon which circuitry, such as memory access circuits (e.g., address decoders, drivers, sense amps, etc.) can be formed. For example, base layer 720 may be a silicon (Si) substrate upon which the active circuitry 732 and 734 are fabricated. The active circuitry 732 and 734 includes analog and digital circuits configured to perform data operations on the memory layer(s) that are fabricated above the base layer 720. An interconnect structure (not shown) including vias, plugs, thrus, and the like, may be used to electrically communicate signals from the active circuitry 730 to the conductive array lines (692, 694).

Figure 8A:
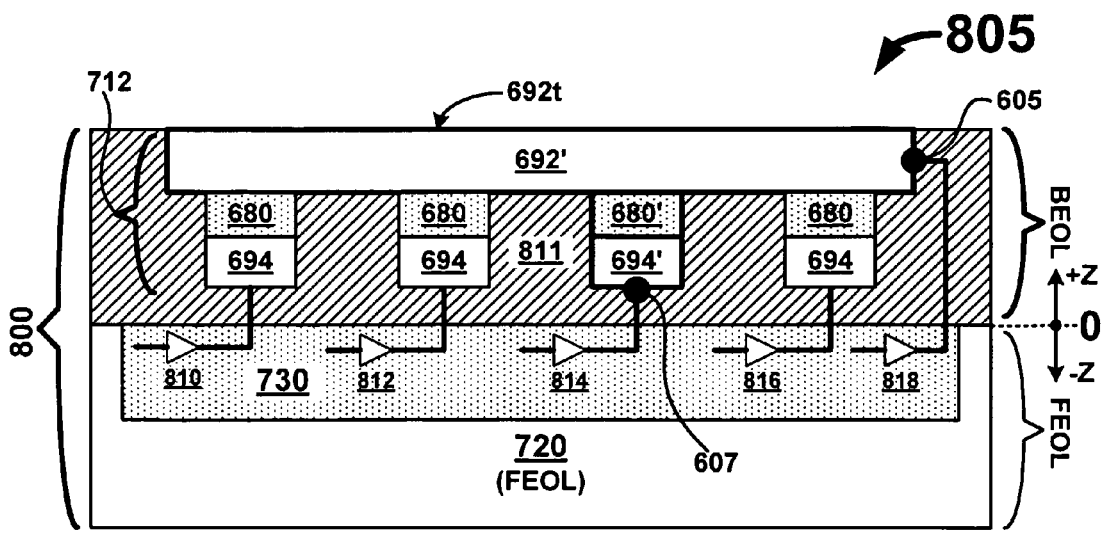
FIG. 8A depicts a cross-sectional view of an integrated circuit including a single layer of memory fabricated over a substrate including active circuitry fabricated in a logic layer.

Reference is now made to FIG. 8A, where integrated circuit 805 includes the base layer 720 and active circuitry 732 and 734 fabricated on the base layer 720. As one example, the base layer 720 can be a silicon (Si) wafer and the active circuitry 732 and 734 can be microelectronic devices formed on the base layer 720 using a CMOS fabrication process. The memory cells 680 and their respective conductive array lines (692, 694) can be fabricated on top of the active circuitry 732 and 734 in the base layer 720. Those skilled in the art will appreciate that an inter-level interconnect structure (not shown) can electrically couple the conductive array lines (692, 694) with the active circuitry 732 and 734 which may include several metal layers. For example, vias can be used to electrically couple the conductive array lines (692, 694) with the active circuitry 732 and 734. The active circuitry 732 and 734 may include but is not limited to address decoders, sense amps, memory controllers, data buffers, direct memory access (DMA) circuits, voltage sources for generating the read and write voltages, just to name a few. For example, active circuits 810-818 can be configured to apply the select voltage potentials (e.g., read and write voltage potentials) to selected conductive array lines (692', 694') for selected memory cell 680' via terminals 605 and 607 that are electrically coupled with outputs of active circuits 814 and 818 respectively. Moreover, active circuits 810-818 may be coupled with the conductive array lines (692', 694') to sense the read current $I_R$ from selected memory cells 680' during a read operation and the sensed current can be processed by active circuits 810-818 to determine the conductivity profiles (e.g., the resistive state) of the selected memory cells 600'. In some applications, it may be desirable to prevent un-selected array lines (692, 694) from floating. The active circuits 810-818 can be configured to apply an un-select voltage potential (e.g., approximately a ground potential) to the un-selected array lines (692, 694). A dielectric material 811 (e.g., SiO$_2$) may be used where necessary to provide electrical insulation between elements of the integrated circuit 700.

Memory material layer $640_{(1\ to\ n)}$ may be an electronic conductor, and include mobile ions (not shown) capable of moving between respective memory material layer $640_i$ and adjacent electrolytic tunnel barrier layer $650_i$ in response to an electric field (not shown) having a predetermined magnitude and direction that may be applied across device 600, where i≧0. In some examples, memory material layer $640_{(1\ to\ n)}$ may comprise a thin film layer of CMO or other perovskite material already described.

Electrolytic tunnel barrier layers $650_{(1\ to\ n)}$ may be formed from an insulating material (e.g., a dielectric material) that may be enabled to allow ion movement. As examples, electrolytic tunnel barrier layer $650_{(1\ to\ n)}$ may be an electrolyte to oxygen and may be enabled to promote an electric field (not shown) across memory device $603_{(1\ to\ n)}$ to facilitate movement of mobile oxygen ions (not shown). In other examples, an electrolytic tunnel barrier layer may be implemented as a material with bulk properties of an electronic insulator that allows ionic movement but is thin enough to allow for electron tunneling ("tunneling"). Tunneling mechanisms for tunnel barrier layers $650_{(1\ to\ n)}$ may include, but are not limited to, single step tunneling processes (e.g., direct tunneling, Fowler-Nordheim tunneling, and thermionic field emission tunneling) or multi-step tunneling processes (e.g., trap-assisted tunneling). Suitable materials for electrolytic tunnel barrier layers $650_{(1\ to\ n)}$ may include, but are not limited to, yttria-stabilized zirconia (e.g., YSZ), zirconia (e.g., $ZrO_x$, or $ZrO_2$), yttrium oxide ($YO_x$), hafnium oxide (e.g., $HfO_x$ or $HfO_2$), gadolinium oxide (e.g., $GdO_x$) lanthanum aluminum oxide (e.g., LAO), and erbium oxide (e.g., $ErO_x$, or $Er_2O_3$), where $x>0$. The electrolytic tunnel barrier layers $650_{(1\ to\ n)}$ can have a thickness of approximately 50 Å or less. The actual thickness will be application dependent, depend on the material selected, and the thickness can be selected to allow for tunneling at voltage magnitudes chosen for data operations to memory cells (e.g., read voltages, write voltages, program and erase voltages).

Referring again to FIG. 6, in some examples, each of layers 100; (and sub-layers, e.g., $110_i$, $122_i$, $124_i$, and $130_i$), $640_i$, $650_i$, and 400; (and sub-layers, e.g., $410_i$, $422_i$, $424_i$, and $430_i$) for devices $603_j$ may be substantially planar surfaces or share similar undulations, and may be enabled for stacked configuration memory array structures, where $n>i>1$. These layers may be formed to substantially known thicknesses as determined by specific applications, using in some examples, fabrication and etching techniques known in the semiconductor art, and in other examples, non-etching techniques to form substantially planar layers. In yet other examples, the layers may be formed using microelectronics fabrication techniques that are well understood in the semiconductor art for forming thin films. By way of examples, fabrication techniques may include, but are not limited to, atomic layer deposition (ALD), chemical vapor deposition (CVD), physical vapor deposition (PVD), sputtering, co-sputtering, molecular beam epitaxy (MBE), spin-on deposition, pulsed laser deposition, ion-beam deposition, electron-beam (e-beam) deposition, or thermal evaporation.

Bi-layer structures 120 and 420, when formed from Ir, may oxidize at a finite rate so that with dual first and second barrier layers (e.g., 122/124, or 422/424), buffering memory material layers from inter-diffusion may be achieved. In some examples, when Ir is oxidized, a top surface of the Ir layer may grow at a finite rate to become $IrO_x$; accordingly, oxidation control may be achieved when forming a bi-layer structure. In other examples, bi-layer structures 120, 420, when formed from Ir, may be able to expand during oxidization, and the barrier layer formed from the oxide (e.g., $IrO_x$) may more closely match the coefficient of thermal expansion of Ir. In examples of forming multi-state resistive memory elements, this compatibility (i.e., thermal expansion) may mitigate stress effectuated when fabricating different layers of a memory device. It may be recognized that the rate of oxidation may depend upon application, temperature, oxygen, partial pressure, and other processing parameters. In yet other examples, bi-layer structures of $Ir/IrO_x$ or $IrO_x/Ir$ may be formed at high temperature processing (e.g., above 400° C.) without inter-diffusion effects, and during the fabrication process, titanium nitride may remain conductive and may not oxidize below 500° C.

In some examples where Ir and $IrO_x$ layers are used, layers 122, 124, 422 and 424 may each be fabricated to thicknesses of approximately 150 Å. In other examples, these layers 122, 124, 422, 424 may be fabricated to thicknesses within a range of approximately 50-500 Å, depending upon the application. In yet other examples, adhesion layers 110, 410 formed from TiN may be fabricated to thicknesses within the range of approximately 50-500 Å. In further examples, adhesion layers 110 and 410 may be formed to different thicknesses other than those described above and are not limited to any specific examples. In still other examples, memory material layer $640_i$, formed from CMO, may be fabricated to a thickness within a range of approximately 235 Å to 270 Å; and, tunnel barrier layer $650_i$, formed from YSZ, may be formed to thicknesses of approximately 50 Å or less, where $n>i>0$.

In general, the devices and methods discussed herein are applicable to semiconductor memory (i.e., material used for data storage) formed and fabricated using various types of materials such as silicon dioxide, silicon oxide, noble metals, conductive metal oxides, and others. Examples of such memories include MRAM and FLASH memories, cross-point array (layout) memory and stacked cross point array memory (e.g., whether single layer non-volatile two-terminal cross-point arrays, or one or more vertically stacked non-volatile two terminal cross arrays), three/third-dimension memory arrays (including those that emulate other types of memory, providing memory combinations within a single component), resistive state memory devices, and memory systems. In reference to FIGS. 1 through 10, materials and/or layers that are described as being electrically coupled with one another can also be in contact with one another as depicted in FIGS. 1 through 10, and can be electrically in series with one another. As one example, in FIG. 6, the layers 400 and 650 are in contact with each other and are electrically in series with each other. Similarly, layer 650 is in contact with layer 640 which is in contact with layer 100, and the layers 400, 650, 640, and 100 are electrically in series with one another.

Figure 8B:
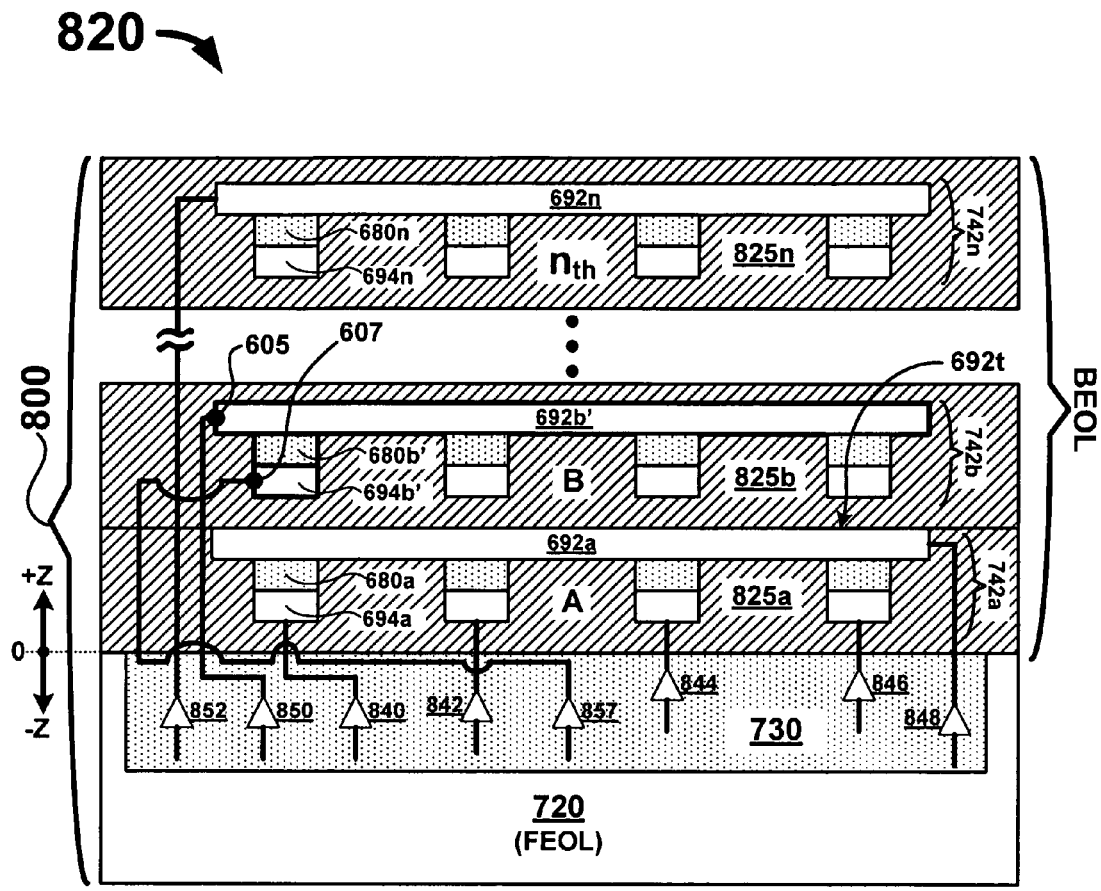
FIG. 8B depicts a cross-sectional view of an integrated circuit including vertically stacked layers of memory fabricated over a substrate including active circuitry fabricated in a logic layer.

Moving now to FIG. 8B, an integrated circuit 820 includes a plurality of non-volatile memory arrays that are vertically stacked above one another (e.g., +Z along the Z-axis) and are positioned above the base layer 720 that includes the active circuitry 730. The integrated circuit 820 includes vertically stacked memory layers A and B and may include additional memory layers up to an nth memory layer. The memory layers A, B, . . . through the nth layer can be electrically coupled with the active circuitry 730 in the base layer 720 by an inter-level interconnect structure as was described above. Layer A includes memory cells 680a and first and second conductive array lines (692a, 694a), Layer B includes memory cells 680b and first and second conductive array lines (692b, 694b), and if the nth layer is implemented, then the nth layer includes memory cells 680n and first and second conductive array lines (692n, 694n). Dielectric materials 825a, 825b, and 825n (e.g., $SiO_2$) may be used where necessary to provide electrical insulation between the memory layers of the integrated circuit 820. Active circuits 840-857 can be configured to apply the select voltage potentials (e.g., read and write voltage potentials) to selected conductive array lines (e.g., 692a, b, . . . n, and 694a, b, . . . n). Driver circuits 850 and 857 are activated to select conductive array lines 692' and 694' to select memory cell 680b' for a data operation. As was described above, the active circuits 730 can be used to sense the read current $I_R$ from selected memory cells 680b' during a read operation and can be configured to apply the un-select voltage potential to the un-selected array lines.

Figure 9:
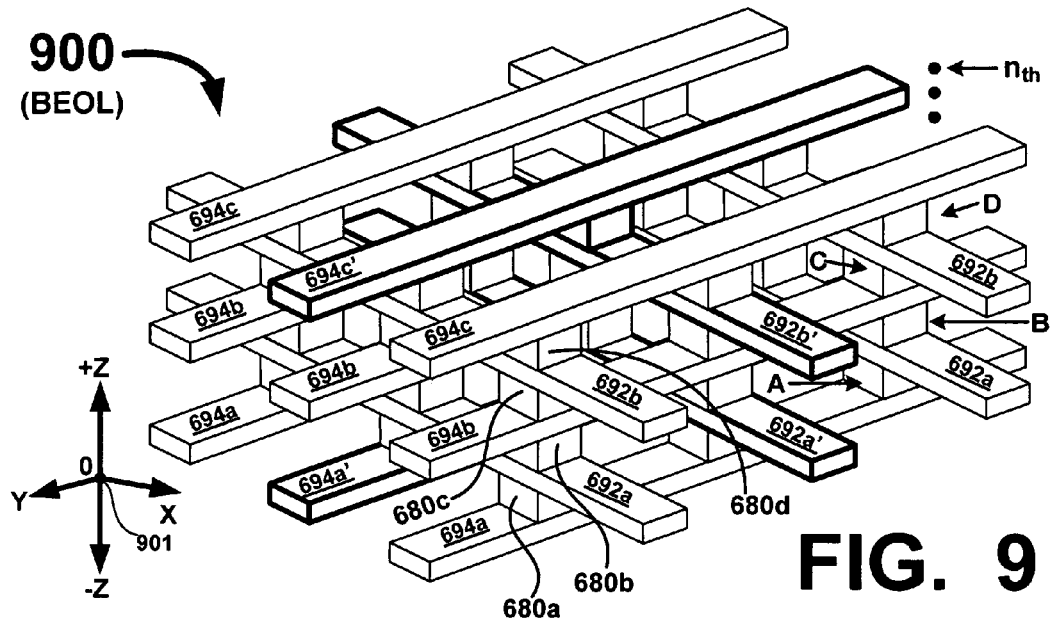
FIG. 9 depicts a vertically stacked layers of memory in which conductive array lines are shared by memory cells in adjacent layers.

Attention is now directed to FIG. 9, where a vertically stacked array 900 includes a plurality of BEOL memory layers A, B, C, and D with each memory layer including memory cells 680a, 680b, 680c, and 680d. Although only four layers are depicted, the array 900 can include additional layers up to an nth layer. The array 900 includes two levels of x-direction conductive array lines 692a and 692b, and three levels of y-direction conductive array lines 694a, 694b, and 694c. In contrast to the integrated circuit 820 depicted in FIG. 8B where each array layer is electrically isolated from other layers by dielectric material 825a-825n, each memory cell 680a, 680b, 680c, and 680d shares a conductive array line with other memory cells that are positioned above, below, or both above and below that memory cell. Conductive array lines 692a' and 694a' select a memory cell 680a' for a data operation, and conductive array lines 692b' and 694c' select a memory cell 680d' for a data operation (see FIG. 10). Here, the array 900 is fabricated BEOL along the +Z axis above a base layer (not shown) which is fabricated first FEOL along the −Z axis of axes 901 as will be descried below in reference to FIG. 10.

Figure 10:
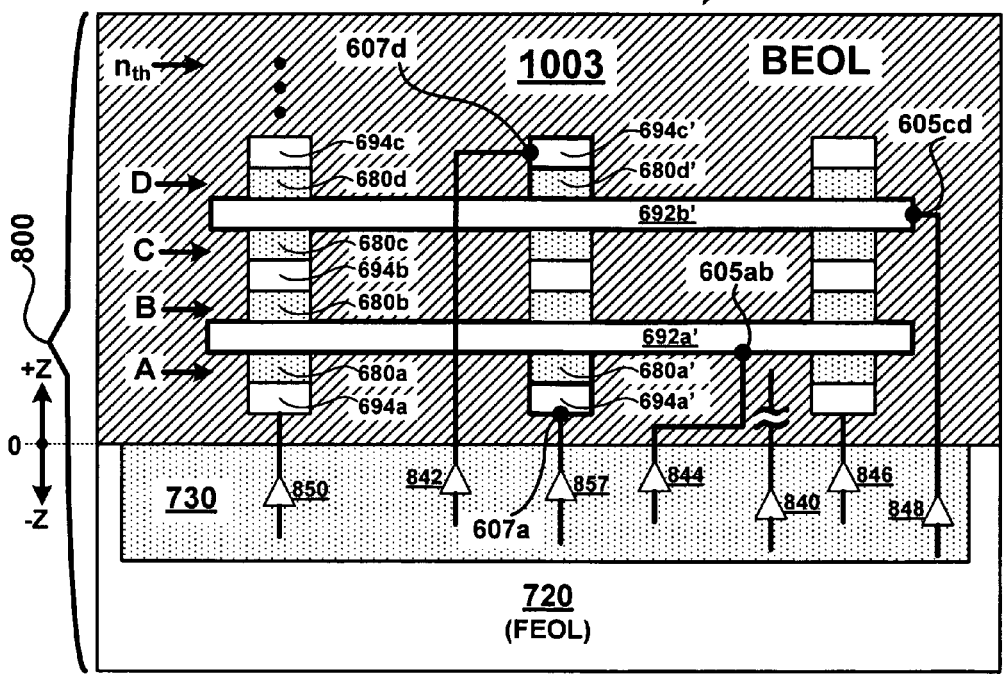
FIG. 10 depicts an integrated circuit including vertically stacked layers of memory with shared conductive array lines fabricated over a substrate including active circuitry fabricated in a logic layer.

Reference is now made to FIG. 10, where an integrated circuit 1000 includes base layer 720, active circuitry 730, and vertically staked memory layers A, B, C, and D that are fabricated above the base layer 720. Here, a vertically stacked array, such as the array 900 with shared conductive array lines depicted in FIG. 9, is fabricated directly above logic (e.g., active circuitry 730) in FEOL base layer 720 as part of a BEOL fabrication process. Active circuits 840-857 are configured to perform data operations on the vertically staked memory layers A, B, C, and D. Driver circuits 844 and 857 are activated to select memory cell 680a' for a data operation and driver circuits 842 and 848 are activated to select memory cell 680d' for a data operation. A dielectric material 1003 is operative to electrically isolate the various components of integrated circuit 1000; however, the memory cells in adjacent layers A, B, C, and D share conductive array lines unlike the configuration depicted in FIG. 8B where the memory cells and their respective conductive array lines are electrically isolated from one another by dielectric material 825a-825n.

In FIGS. 8A, 8B, and 10, the FEOL portion and the BEOL portion of the integrated circuits comprise a single unitary die that can be singulated from a substrate (e.g., a silicon wafer) and positioned in a suitable IC package as will be described below in FIG. 11.

Figure 11:
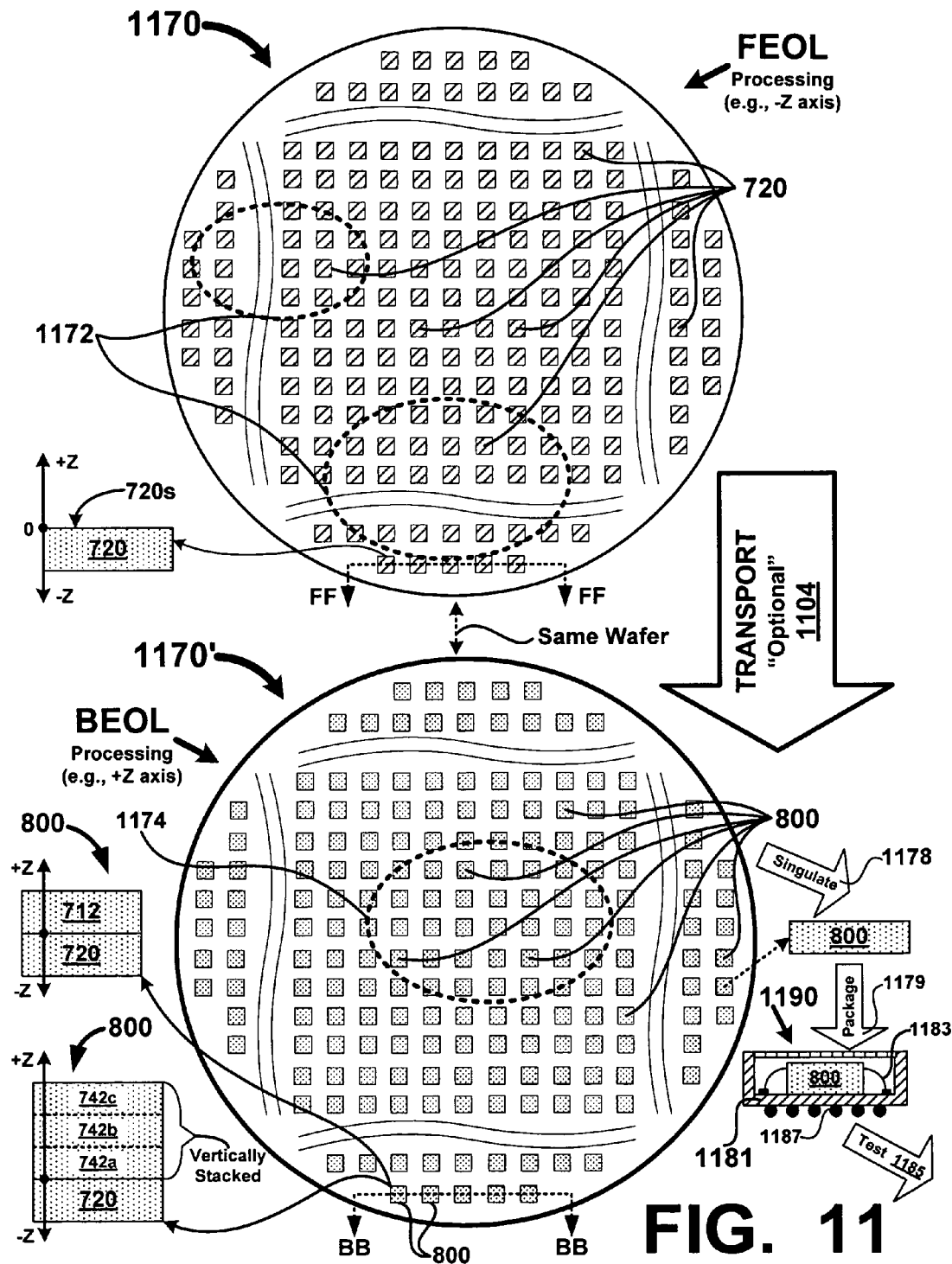
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Moving now to FIG. 11, where a top plan view depicts a single wafer (denoted as 1170 and 1170') at two different stages of fabrication: FEOL processing on the wafer denoted as 1170 during the FEOL stage of processing where active circuitry 730 is formed; followed by BEOL processing on the same wafer denoted as 1170' during the BEOL stage of processing where one or more layers of non-volatile memory are formed. Wafer 1170 includes a plurality of the base layer die 720 (see 720 in FIG. 7) formed individually on wafer 1170 as part of the FEOL process. As part of the FEOL processing, the base layer die 720 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 712 or multiple layers 742a, 742b, 742n) directly on top of each base layer die 720. A base layer die 720 is depicted in cross-sectional view along a dashed line FF-FF where the substrate the die 720 is fabricated on (e.g., a silicon Si wafer) and its associated active circuitry 730 are positioned along the −Z axis. For example, the one or more layers of memory are grown directly on top of an upper surface 720s of each base layer die 720 as part of the subsequent BEOL processing.

During BEOL processing the wafer 1170 is denoted as wafer 1170', which is the same wafer subjected to additional processing to fabricate the memory layer(s) directly on top of the base layer die 720. Base layer die 720 that failed testing may be identified either visually (e.g., by marking) or electronically (e.g., in a file, database, email, etc.) and communicated to the BEOL fabricator and/or fabrication facility. Similarly, performance graded base layer die 720 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 720 to form a finished die 800 (see die 800 in FIGS. 8A, 8B, and 10) that includes the FEOL circuitry portion 720 along the −Z axis and the BEOL memory portion along the +Z axis (see FIGS. 8A, 8B, and 10). A cross-sectional view along a dashed line BB-BB depicts a memory device die 800 with a single layer of memory 712 grown (e.g., fabricated) directly on top of base die 720 along the +Z axis, and alternatively, another memory device die 800 with three vertically stacked layers of memory 742a, 742b, and 742c grown (e.g., fabricated) directly on top of base die 720 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. The die 800 or the IC 1190 can be used in any system requiring non-volatile memory and can be used to emulate a variety of memory types including but not limited to SRAM, DRAM, and FLASH. Unlike conventional FLASH non-volatile memory, the die 800 and/or the IC's 1190 do not require an erase operation prior to a write operation so the latency associated with the erase operation is eliminated and the latency associated with FLASH OS and/or FLASH file system required for managing the erase operation is eliminated. Another application for the IC's 1190 is as a replacement for conventional FLASH-based non-volatile memory in solid state drives (SSD's) or hard disc drives (HDD's).

The foregoing examples have been described in some detail for purposes of clarity of understanding, but are not limited to the details provided. There are many alternative ways and techniques for implementation. The disclosed examples are illustrative and not restrictive.

What is claimed is:

1. A memory device, comprising:
a re-writeable non-volatile memory element having exactly two terminals and including electrically in series with its two terminals:
multiple layers of memory material made from a conductive binary oxide comprised of a metal oxide having a form $A_XO_Y$, where A is a transition metal, O is oxygen, X>0, and Y>0; and an electrically conductive barrier layer coupled between an at least one layer of the multiple layers of memory material and an electrically conductive layer which is in contact with the barrier layer.

2. The memory device of claim 1, wherein the electrically conductive layer comprises an adhesion layer of titanium nitride.

3. The memory device of claim 1, wherein the barrier layer comprises a bi-layer structure comprised of a first barrier layer made from a first material and a second barrier layer made from a second material that is different than the first material.

4. The memory device of claim 1, and further comprising:
a tunnel barrier layer in contact with the at least one layer of the multiple layers of memory material.

5. The memory device of claim 1, and further comprising an electrically conductive electrode layer in contact with the barrier layer and in contact with the at least one layer of the multiple layers of memory material.

6. The memory device of claim 1, wherein the barrier layer comprises a conductive oxide.

7. The memory device of claim 6, wherein a first portion of the conductive oxide comprises a metal and a second portion of the conductive oxide comprises a metal oxide that is an oxidized form of the metal of the first portion.

8. The memory device of claim 1, wherein the conductive binary oxide is doped with a material selected to alter an electrical conductivity of the conductive binary oxide.

9. The memory device of claim 1, wherein the conductive binary oxide includes mobile oxygen ions.

10. A memory device comprising:
an conductive oxide electrode including an electrically conductive barrier layer and an electrically conductive electrode layer, wherein the barrier layer is in contact with the electrode layer and an adhesion layer; and
a memory element in contact with the electrode layer of the conductive oxide electrode.

11. The memory device of claim 10, wherein the adhesion layer comprises titanium nitride.

12. The memory device of claim 10, wherein the barrier layer comprises a bi-layer structure comprised of a first barrier layer made from a first material and a second barrier layer made from a second material that is different than the first material.

13. The memory device of claim 10, wherein the memory element further comprising at least one layer of a conductive binary oxide comprised of a metal oxide having a form $A_XO_Y$, where A is a transition metal, O is oxygen, X>0, and Y>0.

14. The memory device of claim 13, wherein the conductive binary oxide is doped with a material selected to alter an electrical conductivity of the conductive binary oxide.

15. The memory device of claim 13, wherein the conductive binary oxide includes mobile oxygen ions.

16. The memory device of claim 13, wherein the memory element further comprising a tunnel barrier layer in contact with the at least one layer of the conductive binary oxide.

17. The memory device of claim 10, wherein the barrier layer comprises a conductive oxide having a first portion comprising a metal and a second portion comprising a metal oxide that is an oxidized form of the metal of the first portion.

18. A device comprising:
a first conductive oxide electrode including a first barrier layer, a first adhesion layer, and a first electrode layer, wherein the first barrier layer is electrically coupled between the first adhesion layer and the first electrode layer;
a second conductive oxide electrode including a second barrier layer, a second adhesion layer, and a second electrode layer, wherein the second barrier layer is electrically coupled between the second adhesion layer and the second electrode layer; and
a memory element in contact with the first conductive oxide electrode and the second conductive oxide electrode.

19. The device of claim 18, wherein first adhesion layer is electrically coupled with active circuitry.

20. The device of claim 18, wherein the first barrier layer comprises a bi-layer structure comprised of a first material layer made from a first material and a second material layer made from a second material that is different than the first material.

21. The device of claim 20, wherein the first material layer comprises iridium.

22. The device of claim 21, wherein the second material layer comprises iridium oxide.

23. The device of claim 18, wherein the second barrier layer comprises a bi-layer structure comprised of a first material layer made from a first material and a second material layer made from a second material that is different than the first material.

24. The device of claim 23, wherein the first material layer comprises iridium.

25. The device of claim 24, wherein the second material layer comprises iridium oxide.

26. The device of claim 18, wherein the memory element further comprising:
at least one layer of a conductive binary oxide; and
a tunnel barrier layer in contact with the at least one layer of the conductive binary oxide.

27. The device of claim 26, wherein the tunnel barrier layer is formed from a material selected from the group consisting of yttria-stabilized zirconia, zirconia, hafnium oxide, yttrium oxide, gadolinium oxide, lanthanum aluminum oxide, and erbium oxide.

28. The device of claim 18, wherein the memory element is in contact with the first electrode layer of the first conductive oxide electrode and in contact with the second electrode layer of the second conductive oxide electrode.

29. The device of claim 18, wherein the first electrode layer and the second electrode layer comprise platinum.

30. The device of claim 18, wherein the first adhesion layer and the second adhesion layer are formed a material selected from the group consisting of titanium nitride, titanium aluminum nitride, titanium silica nitride, and tantalum nitride.

* * * * *